US010755402B2

(12) United States Patent
He et al.

(10) Patent No.: US 10,755,402 B2
(45) Date of Patent: *Aug. 25, 2020

(54) METHOD FOR DISTINGUISHING SEMICONDUCTING NANOWIRES FROM METALLIC NANOWIRES

(71) Applicants: Tsinghua University, Beijing (CN); HON HAI PRECISION INDUSTRY CO., LTD., New Taipei (TW)

(72) Inventors: Yu-Jun He, Beijing (CN); Dong-Qi Li, Beijing (CN); Jin Zhang, Beijing (CN); Li-Na Zhang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 70 days.

This patent is subject to a terminal disclaimer.

(21) Appl. No.: 15/986,924

(22) Filed: May 23, 2018

(65) Prior Publication Data
US 2018/0276809 A1 Sep. 27, 2018

Related U.S. Application Data

(63) Continuation of application No. 14/511,166, filed on Oct. 9, 2014, now Pat. No. 10,013,753.

(30) Foreign Application Priority Data

Oct. 10, 2013 (CN) .......................... 2013 1 0469579

(51) Int. Cl.
*G06T 7/00* (2017.01)
*H01L 21/66* (2006.01)

(52) U.S. Cl.
CPC ............ *G06T 7/0006* (2013.01); *H01L 22/12* (2013.01); *G06T 2207/10061* (2013.01); *G06T 2207/30148* (2013.01)

(58) Field of Classification Search
None
See application file for complete search history.

(56) References Cited

PUBLICATIONS

Duan, Xiangfeng, et al. "Indium phosphide nanowires as building blocks for nanoscale electronic and optoelectronic devices." Nature 409.6816 (2001): 66-69.*

(Continued)

*Primary Examiner* — Vu Le
*Assistant Examiner* — Tracy Mangialaschi
(74) *Attorney, Agent, or Firm* — ScienBiziP, P.C.

(57) ABSTRACT

A method for distinguishing semiconducting nanowires from metallic nanowires is related and including: applying nanowires on a substrate; making a metal electrode on the substrate and electrically connected to the nanowires; taking a SEM image of the nanowires and the metal electrode, wherein the SEM image comprises light segments, and each light segment corresponds to one nanowire; and comparing length of each light segment with length of corresponding one nanowire, when the first length is same as the second length, the corresponding one nanowires is a metallic nanowire; when the first length is shorter than the second length, the corresponding one nanowire is a semiconducting nanowire.

17 Claims, 8 Drawing Sheets

(56) References Cited

PUBLICATIONS

Qian, Peng, et al. "Electrochemical identification of metallic and semiconducting single-walled carbon nanotubes." The Journal of Physical Chemistry C 112.35 (2008): 13346-13348.*

Li J, He Y, Han Y, Liu K, Wang J, Li Q, Fan S, Jiang K. Direct identification of metallic and semiconducting single-walled carbon nanotubes in scanning electron microscopy. Nano letters. Jul. 3, 2012;12(8):4095-101.*

Jin, Zhong, et al. "Ultralow feeding gas flow guiding growth of large-scale horizontally aligned single-walled carbon nanotube arrays." Nano letters 7.7 (2007): 2073-2079.*

Li J, He Y, Han Y, Liu K, Wang J, Li Q, Fan S, Jiang K. Direct identification of metallic and semiconducting single-walled carbon nanotubes in scanning electron microscopy. Nano letters. Jul. 3, 2012;12(8):4095-101. (Year: 2012).*

Ho, Xinning, et al. "Theoretical and experimental studies of Schottky diodes that use aligned arrays of single-walled carbon nanotubes.";Nano Research;3.6 (2010): 444-451. (Year: 2010).*

Li, Yiming, et al. "On the origin of preferential growth of semiconducting single-walled carbon nanotubes.";The journal of physical chemistry B;109.15 (2005): 6968-6971. (Year: 2005).*

\* cited by examiner

METHOD FOR DISTINGUISHING SEMICONDUCTING NANOWIRES FROM METALLIC NANOWIRES

FIELD

The disclosure generally relates to method for evaluating properties of nanowires, and particularly, to a method for evaluating bandgap distributions of nanowires.

BACKGROUND

Nanowires, such as silicon nanowires, silica nanowires, zinc oxide nanowires, carbon nanotubes, etc., with quasi one-dimensional structure and unique electrical properties, are widely applied to electronic devices, field emission technology, biological medicine, hydrogen storage technology, and many other fields of research work.

As one type of nanowires, semiconducting single-walled carbon nanotube (s-SWCNT) is a promising material for next generation electronic and optoelectronic devices, due to its excellent properties such as high mobility and ballistic transport of charge carriers, high ON/OFF ratio, and direct bandgap electronic structure etc. These properties are primarily determined by s-SWCNT's bandgap and the Schottky barrier formed at the metal-SWCNT contact. Therefore, the precise control of the bandgap and Schottky barrier, is the greatest challenge for real device applications. To obtain SWCNTs with narrow bandgap distribution for device applications, it is important to develop an efficient and effective method for evaluating the bandgap distribution.

Thus, there is room for improvement within the art.

BRIEF DESCRIPTION OF THE DRAWINGS

Many aspects of the present membrane electrode assembly and fuel cell using the same can be better understood with references to the following drawings. The components in the drawings are not necessarily drawn to scale, the emphasis instead being placed upon clearly illustrating the principles of the present membrane electrode assembly and fuel cell using the same.

Figure 1:
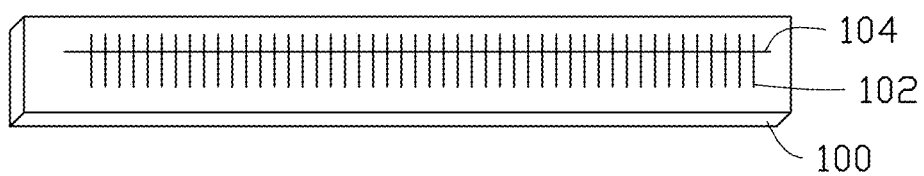
FIG. 1 is a schematic view of nanowires connected to a metal electrode in a method for evaluating bandgap distributions of the nanowires in accordance with one embodiment.

Corresponding reference characters indicate corresponding parts throughout the several views. The exemplifications set out herein illustrate at least one present embodiment of the membrane electrode assembly and fuel cell using the same, in at least one form, and such exemplifications are not to be construed as limiting the scope of the disclosure in any manner.

DETAILED DESCRIPTION

References will now be made to the drawings, in detail, to describe embodiments of the membrane electrode assembly and fuel cell using the same.

Referring to FIG. 1, a method for evaluating bandgap distributions of nanowires will be described. The method includes one or more of the following steps:

S1, providing a plurality of nanowires 102 located on a surface of a substrate 100;

S2, providing a metal electrode 104 on the surface and electrically connected to the plurality of nanowires 102;

S3, taking a SEM image on the plurality of nanowires 102 and the metal electrode 104;

S4, evaluating the bandgap distributions of the nanowires 102 through the SEM image.

In step S1, the substrate 100 can be made of silicon, silica, or quartz. A thickness and area of the substrate 100 are not limited, as an SEM image can be obtained. The plurality of nanowires 102 can be silicon nanowires, silica nanowires, zinc oxide nanowires, carbon nanotubes, molybdenum disulfide, or graphene nanoribbons. At least one of the plurality of nanowires 102 is semiconducting nanowire. In one embodiment, the plurality of nanowires 102 extends along a same direction, and is spaced with each other. The plurality of nanowires 102 can grow on the surface of the substrate 100, or transfer from another substrate. In one embodiment, the substrate 100 has a planar surface; the plurality of nanowires 102 is parallel and spaced located on the planar surface.

In one embodiment, the plurality of nanowires 102 is SWCNTs. The SWCNTs can be s-SWCNTs or include parts of m-SWCNTs. At least parts of the SWCNTs are s-SWCNTs. The m-SWCNTs of the SWCNTs have no influence on the result of the evaluation of the bandgap distributions of the nanowires 102.

In one embodiment, the SWCNTs are synthesized on a quartz substrate via chemical vapor deposition (CVD). The method for synthesizing the SWCNTs comprises the steps of:

S11, providing a ST-cut quartz substrate;

S12, dispersing an iron catalyst layer on a surface of the ST-cut quartz substrate;

S13, locating the ST-cut quartz substrate in a quartz tube; and

S14, introducing methane and hydrogen into the quartz tube at 800 centigrade degrees to 950 centigrade degrees for about 10 minutes to about 20 minutes.

Figure 2:
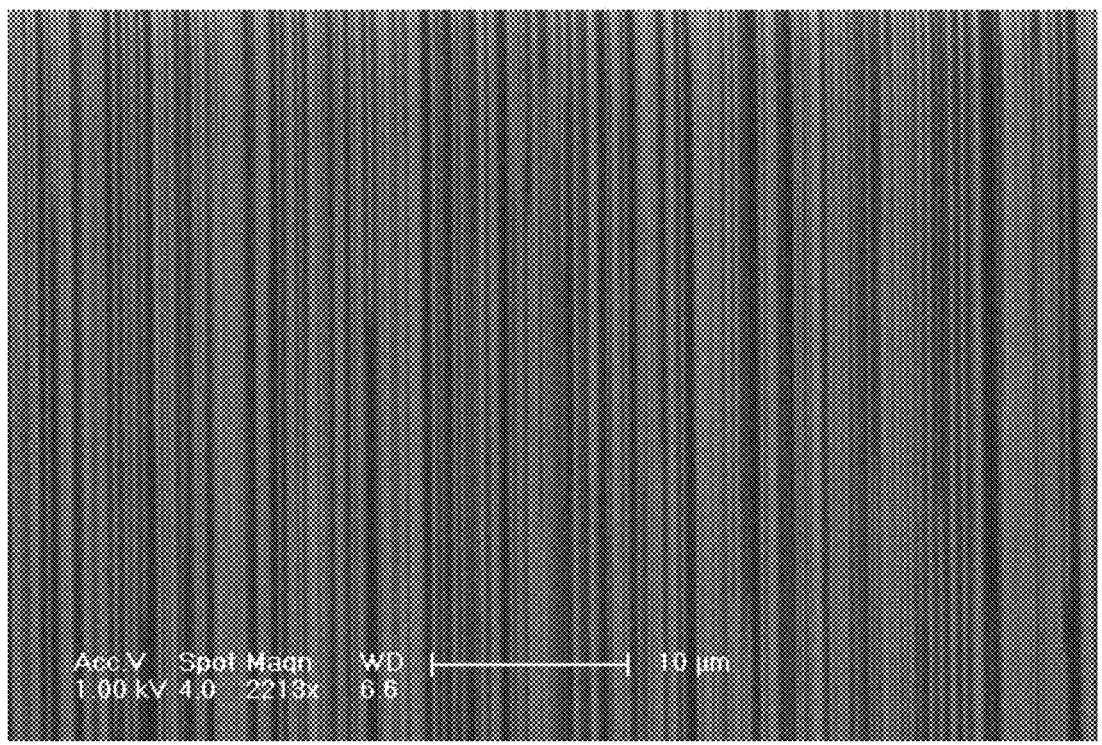
FIG. 2 is a Scanning Electron Microscope (SEM) image of a plurality of SWCNTs in accordance with one embodiment.

Referring to FIG. 2, the SWCNTs obtained by above method are spaced from and parallel to each other. The SWCNTs have a same length about 100 microns. A distance between the adjacent parallel SWCNTs is about 200 nanometers to about 1000 nanometers. The SWCNTs on the ST-cut quartz substrate can be transferred onto a $SiO_2/Si$ substrate.

In step S2, a material of the metal electrode 104 is not limited, so long as Schottky barrier can be formed between the nanowires 102 and the metal electrode 104 when the nanowires 102 contact the metal electrode 104. The material of the metal electrode 104 can be titanium, palladium, gold, chromium, aluminum or scandium. A shape and width of the metal electrode 104 are unlimited, as long as each one of the nanowires 102 can contact with the metal electrode 104. In one embodiment, the metal electrode 104 is bar-shaped and made of titanium. In one embodiment, the metal electrode 104 is made by a electron beam lithography method, the method comprises the steps of:

S21, locating a first resist layer on the surface of the substrate 100;

S22, locating a second resist layer on the first resist layer;

S23, forming a required patterned resist layer by electron beam lithography;

S24, depositing a metal layer on the surface of the substrate 100 through the required patterned resist layer; and S25, removing the maintained resist material.

Figure 3:
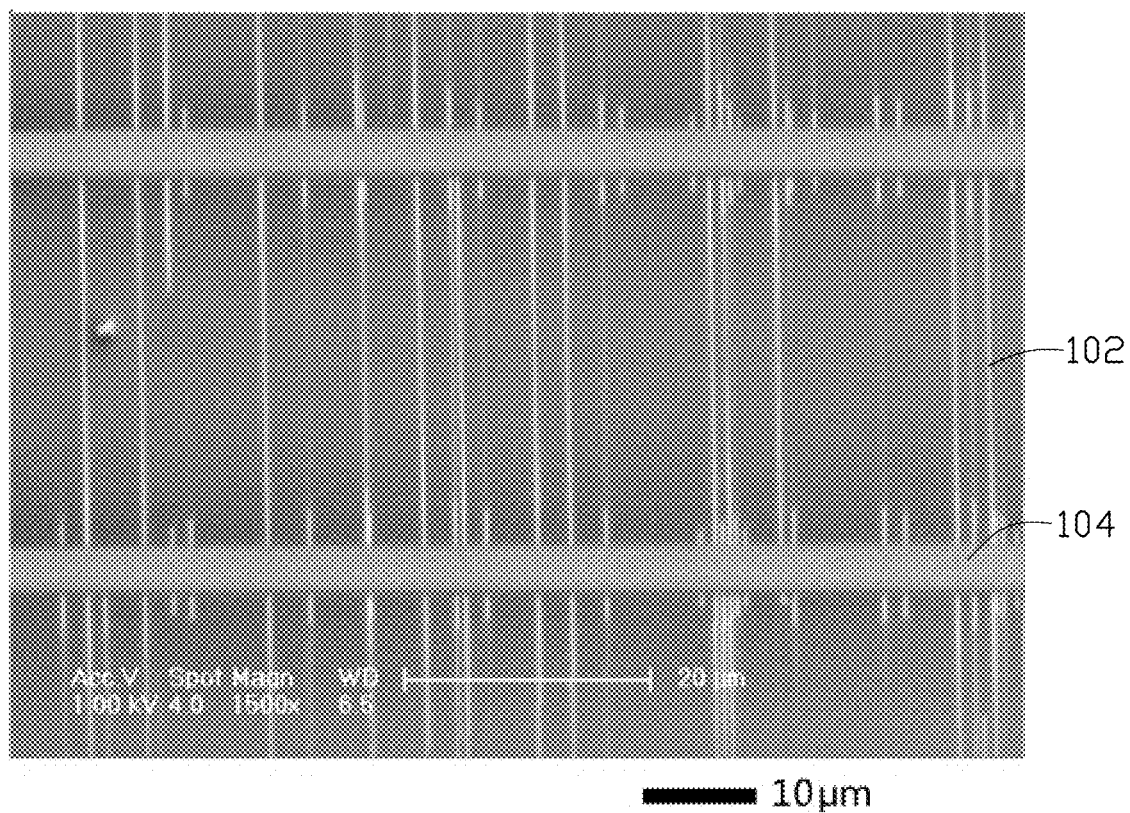
FIG. 3 is a SEM image of a plurality of SWCNTs connected to two metal electrodes in accordance with one embodiment.

The first resist layer is made of methyl methacrylate (MMA). The second resist layer is made of polymethyl methacrylate (PMMA). Referring to FIG. 3, in one embodiment, two parallel metal electrodes 104 intersect and contact the plurality of parallel nanowires 102. The two metal electrodes 104 are perpendicular to the plurality of parallel nanowires 102.

In step S3, the SEM image is taken on the plurality of nanowires 102 and the metal electrode 104 on the substrate 100 by a SEM device. Referring to FIG. 3, a plurality of bright segments exists at the contact area between the metal electrode 104 and the plurality of nanowires 102. The plurality of bright segments is according to the plurality of nanowires 102. Each of the plurality of bright segments extends along a corresponding nanowire 102. In FIG. 3, in one embodiment, the plurality of nanowires 102 is SWCNTs. When the length of the bright segment is same as the length of the corresponding SWCNT, the corresponding SWCNT is metallic. When the length of the bright segment is not same as the length of the corresponding SWCNT, the corresponding SWCNT is semiconducting. In other words, if the bright segment is a continuous bright line, the corresponding SWCNT is metallic. If the bright segment is a discontinuous or broken bright line, the corresponding SWCNT is semiconducting. Therefore, the semiconducting and metallic SWCNTs can be directly differentiated from each other in the SEM image shown in FIG. 3.

Figure 4:
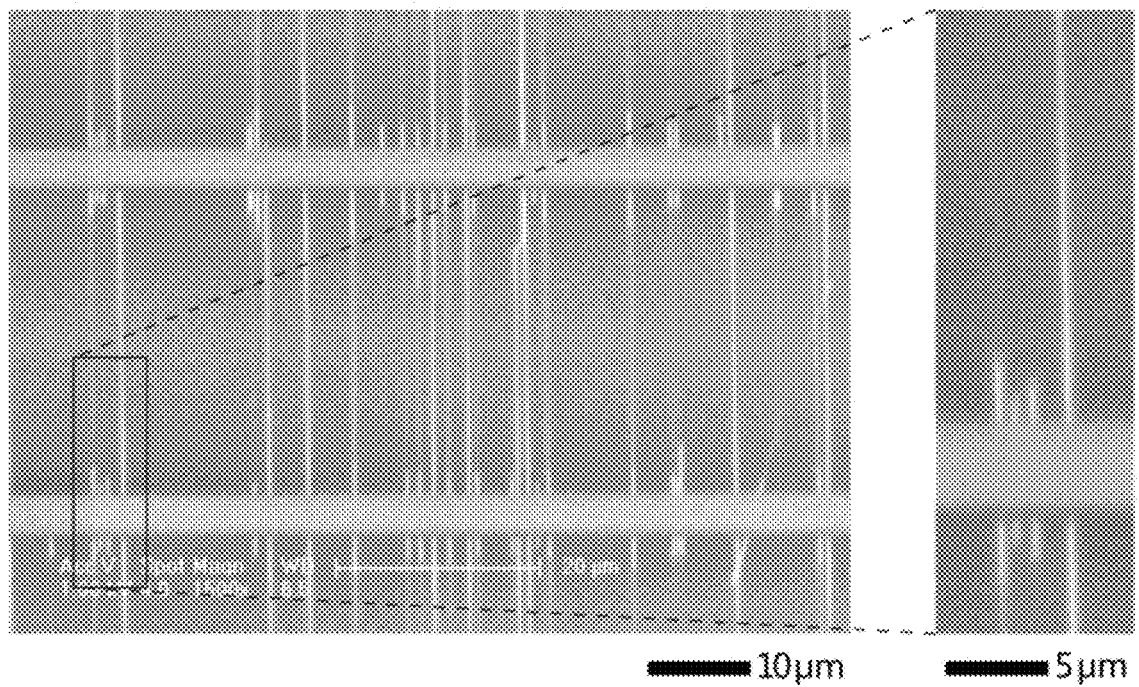
FIG. 4 is an amplified SEM image of three s-SWCNTs and one metal-SWCNT (m-SWCNT).
Figure 5:
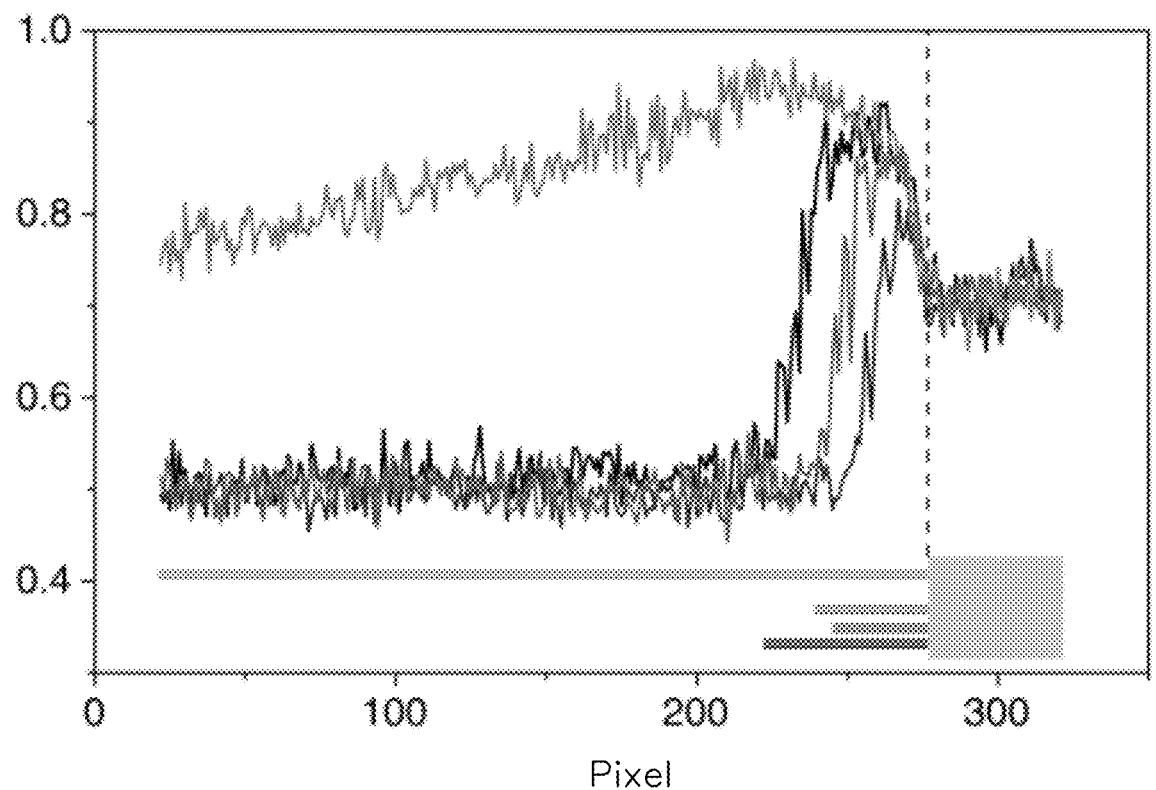
FIG. 5 is grayscale curves of the three s-SWCNTs and the one m-SWCNT in FIG. 4.
Figure 6:
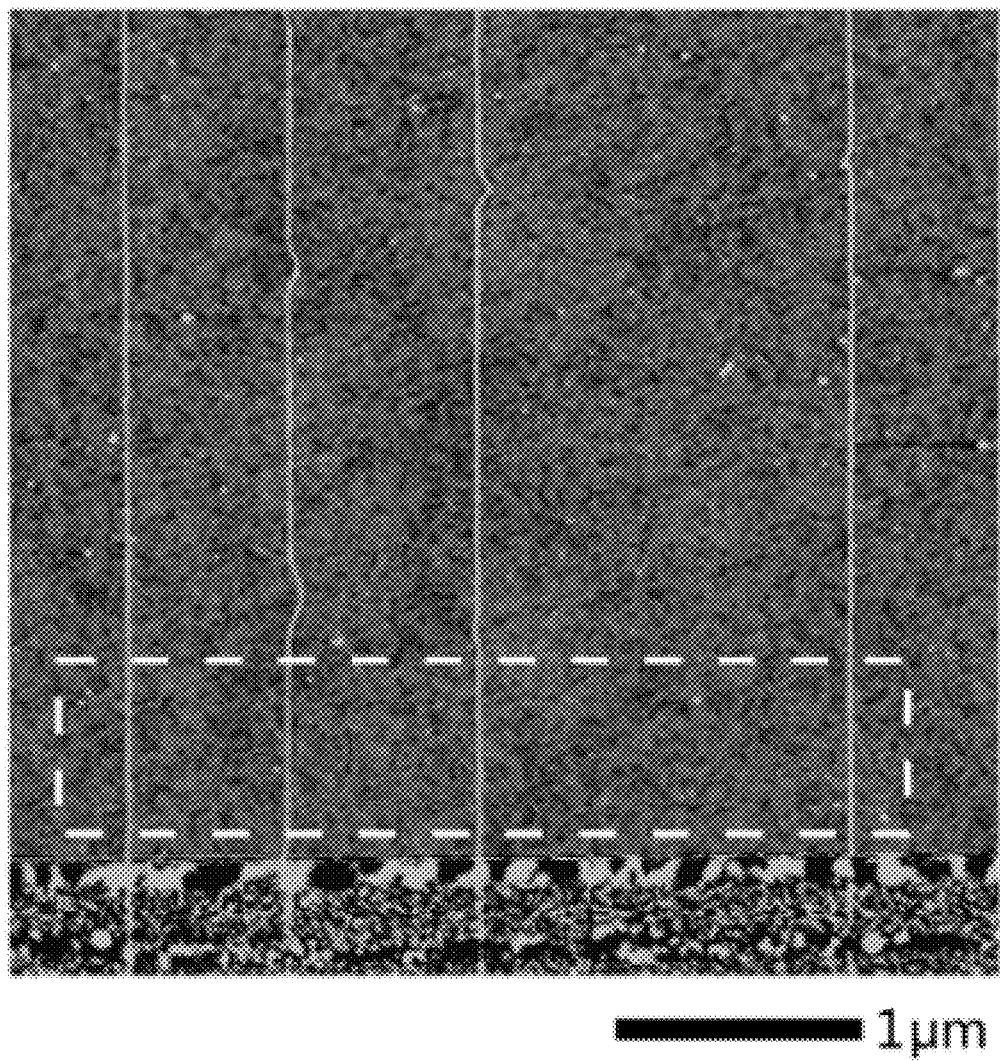
FIG. 6 is an Atomic Force Microscope (AFM) image of the three s-SWCNTs and the one m-SWCNT in FIG. 4.
Figure 7:
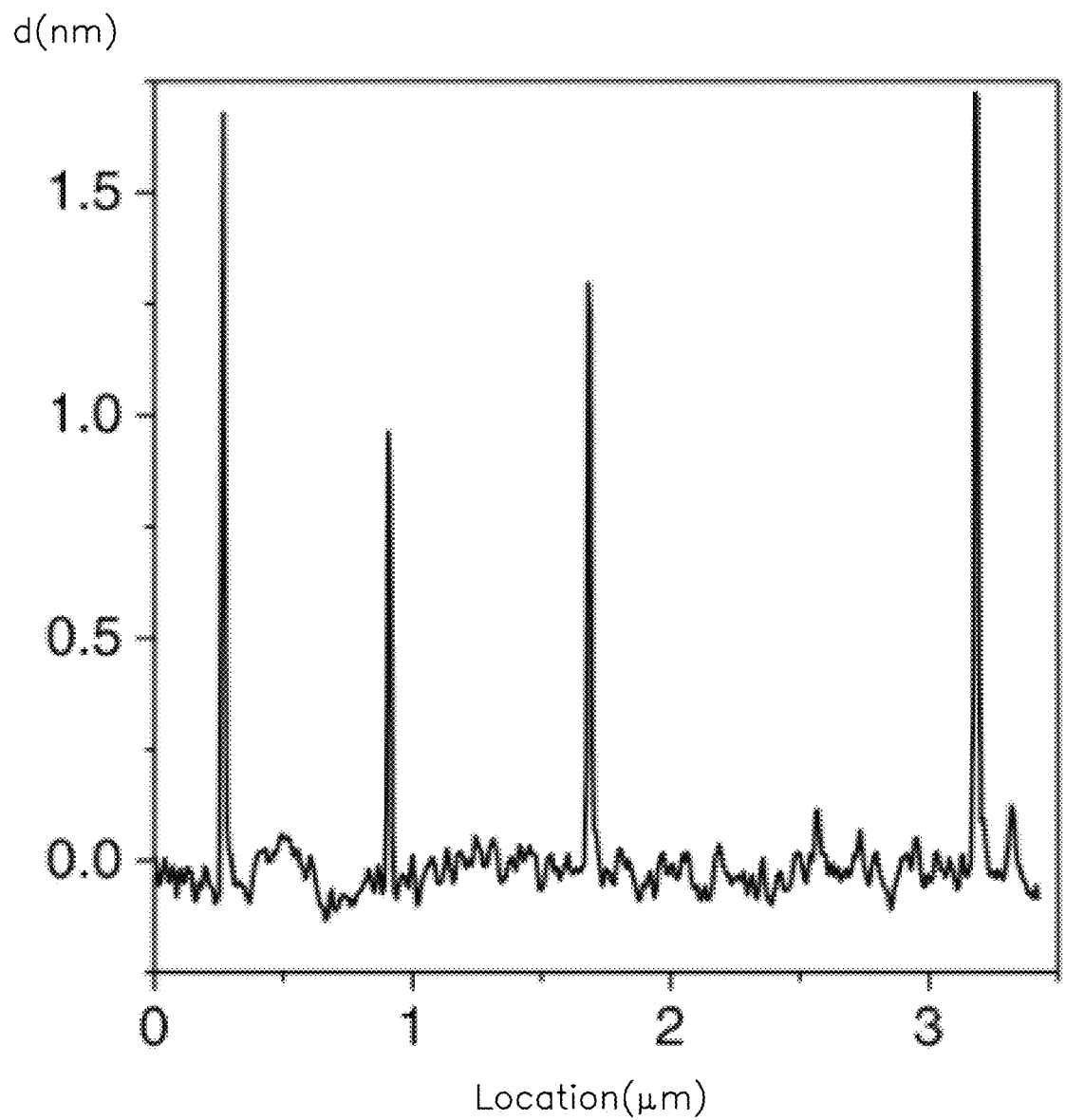
FIG. 7 is a view of a relationship of the diameter of the three s-SWCNTs and the one m-SWCNT in FIG. 4.
Figure 8:
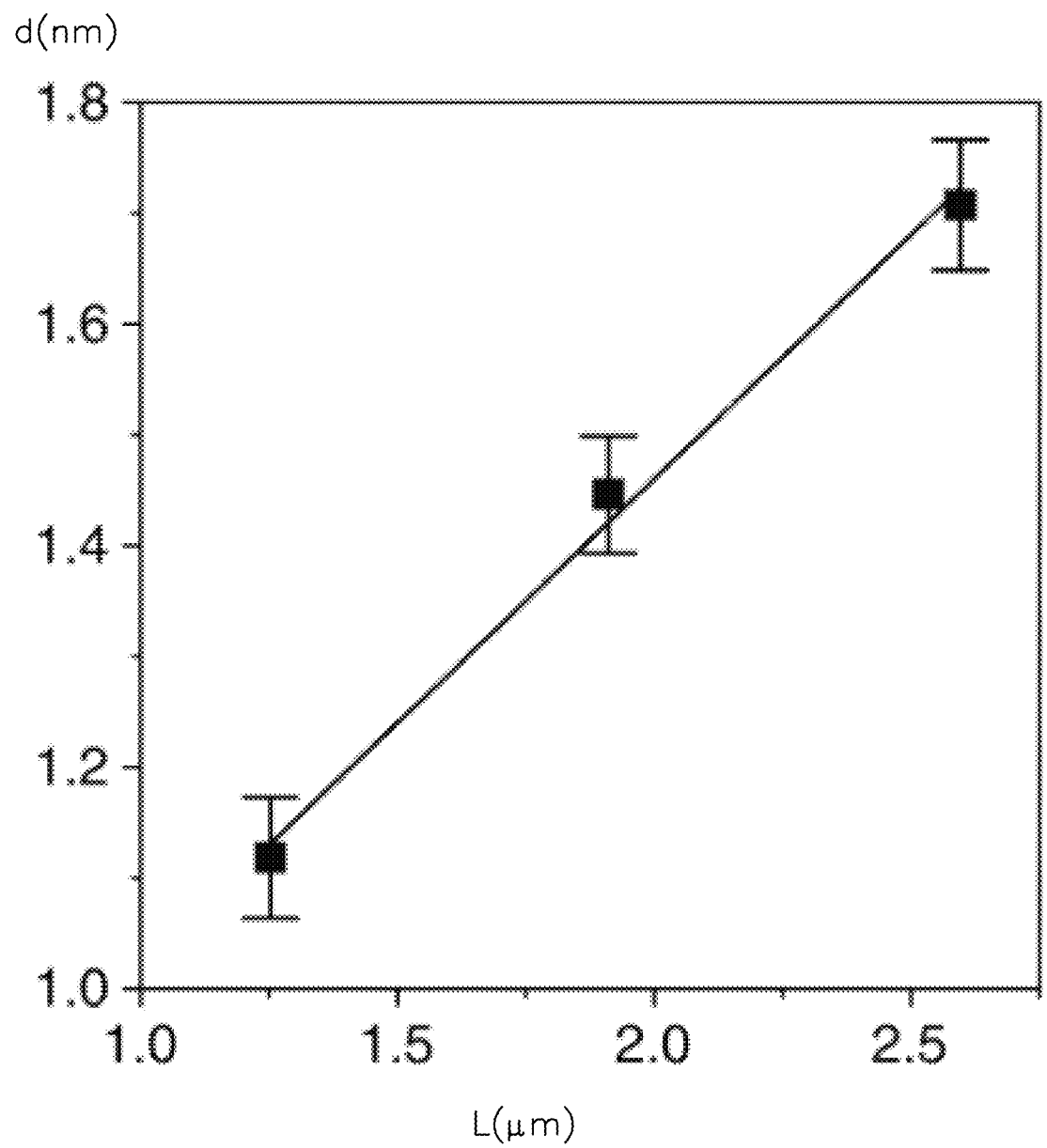
FIG. 8 is a view of a linear relationship between length of bright segment ($L_{BS}$) and the diameter of the three s-SWCNTs in FIG. 4.

In step S4, in one embodiment, to evaluate the bandgap distribution of the SWNTs shown in FIG. 3, a length of the bright segment according to the corresponding SWNT is defined as $L_{BS}$. The $L_{BS}$ can be measured by any method in the art, such as being measured by a ruler, or measured by a computer. Referring to FIG. 4, as an example, four SWCNTs are selected, three of the four SWCNTs are semiconducting SWCNTs, one of the four SWCNTs is metallic SWCNT. In FIG. 5, grayscale curves of the four SWCNTs in FIG. 4 are shown. The $L_{BS}$ of each of the three s-SWCNTs can be read in FIG. 5, and is respectively 1.25 micron, 1.91 micron, and 2.6 micron. Referring to FIG. 6, the AFM image of the three s-SWCNTs and the one m-SWCNT is shown. Referring to FIG. 7, the relationship of the diameters (d) of the three s-SWCNTs is shown, and the diameters (d) of the three s-SWCNTs is respectively 1.12 nanometer, 1.45 nanometer, 1.71 nanometer. Referring to FIG. 8, a linear relationship between the $L_{BS}$ and the diameters (d) of s-SWCNTs is shown, and the $L_{BS}$ of the s-SWCNT is proportional to the diameter (d) of the s-SWCNT. Because the band gap ($E_g$) of the s-SWCNTs is inversely proportional to the diameter (d) of the s-SWCNTs. It is concluded that the band gap ($E_g$) of the s-SWCNT is inversely proportional to the $L_{BS}$ of the s-SWCNT. Therefore, in step S4, via the SEM image of the nanowires 102 connected to the metal electrode 104, the bandgap distributions of the nanowires 102 can be obtained by contrasting the $L_{BS}$ of each of the nanowires 102.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

It is also to be understood that the above description and the claims drawn to a method may comprise some indication in reference to certain steps. However, the indication used is only to be viewed for identification purposes and not as a suggestion as to an order for the steps.

What is claimed is:

1. A method for distinguishing semiconducting nanowires from metallic nanowires, comprising:

applying a plurality of nanowires on a surface of a substrate;

making a metal electrode on the surface of the substrate, wherein the metal electrode is electrically connected to the plurality of nanowires;

taking a Scanning Electron Microscope (SEM) image of both the plurality of nanowires and the metal electrode, wherein the SEM image comprises a plurality of light segments caused by Schottky barrier between the plurality of nanowires and the metal electrode, and each of the plurality of light segments corresponds to one of the plurality of nanowires; and comparing a first length of each of the plurality of light segments with a second length of corresponding one of the plurality of nanowires, when the first length of one of the plurality of light segments is same as the second length of the corresponding one of the plurality of nanowires, the corresponding one of the plurality of nanowires is a metallic nanowire; when the first length of one of the plurality of light segments is shorter than the second length of the corresponding one of the plurality of nanowires, the corresponding one of the plurality of nanowires is a semiconducting nanowire.

2. The method as claimed in claim 1, wherein the plurality of nanowires are silicon nanowires, silica nanowires, zinc oxide nanowires, carbon nanotubes, molybdenum disulfide, or graphene nanoribbons, and the substrate is a silicon substrate, a silica substrate, or a quartz substrate.

3. The method as claimed in claim 1, wherein the plurality of nanowires are a plurality of single-walled carbon nanotubes (SWCNTs).

4. The method as claimed in claim 3, wherein the applying the plurality of nanowires on the surface of the substrate comprises:

dispersing an iron catalyst layer on a stable temperature-cut (ST-cut) quartz substrate surface;

locating the ST-cut quartz substrate in a quartz tube; and introducing a methane and a hydrogen into the quartz tube at a temperature of 800 centigrade degrees to 950 centigrade degrees for about 10 minutes to about 20 minutes.

5. The method as claimed in claim 1, wherein the metal electrode comprise a material selected from the group consisting of titanium, palladium, gold, chromium, aluminum, and scandium.

6. The method as claimed in claim 1, wherein the plurality of nanowires is parallel with and spaced apart from each other; and the plurality of bright segments is parallel with and spaced apart from each other.

7. The method as claimed in claim 6, wherein the metal electrode is substantially perpendicular to the plurality of nanowires.

8. A method for distinguishing semiconducting nanowires from metallic nanowires, comprising:
applying a plurality of nanowires on a surface of a substrate;
making a first metal electrode and a second metal electrode on the surface of the substrate, wherein the first metal electrode and the second metal electrode are substantially parallel to and spaced apart from each other, and each of the first metal electrode and the second metal electrode is intersected with and in direct contact with the plurality of nanowires;
taking a Scanning Electron Microscope (SEM) image of all the plurality of nanowires, the first metal electrode and the second metal electrode, wherein the SEM image comprises a plurality of light segments caused by Schottky barrier between the plurality of nanowires and one of the first metal electrode and second metal electrode, and each of the plurality of light segments corresponds to one of the plurality of nanowires; and
judging the plurality of nanowires according the plurality of light segments, when one of the plurality of light segments is continuous, the corresponding one of the plurality of nanowires is a metallic nanowire; when one of the plurality of light segments is discontinuous, the corresponding one of the plurality of nanowires is a semiconducting nanowire.

9. The method as claimed in claim 8, wherein the plurality of nanowires are silicon nanowires, silica nanowires, zinc oxide nanowires, carbon nanotubes, molybdenum disulfide, or graphene nanoribbons, and the substrate is a silicon substrate, a silica substrate, or a quartz substrate.

10. The method as claimed in claim 8, wherein the plurality of nanowires are a plurality of single-walled carbon nanotubes (SWCNTs).

11. The method as claimed in claim 8, wherein each of the first metal electrode and the second metal electrode comprise a material selected from the group consisting of titanium, palladium, gold, chromium, aluminum, and scandium.

12. The method as claimed in claim 8, wherein the plurality of nanowires is parallel with and spaced apart from each other; and each of the first metal electrode and the second metal electrode is substantially perpendicular to the plurality of nanowires.

13. A method for distinguishing semiconducting nanowires from metallic nanowires, comprising:
applying a plurality of nanowires on a surface of a substrate;
making a first metal electrode and a second metal electrode on the surface of the substrate, wherein the first metal electrode and the second metal electrode are substantially parallel to and spaced apart from each other, and each of the first metal electrode and the second metal electrode is intersected with and in direct contact with the plurality of nanowires;
taking a Scanning Electron Microscope (SEM) image of all the plurality of nanowires, the first metal electrode and the second metal electrode, wherein the SEM image comprises a plurality of light segments caused by Schottky barrier between the plurality of nanowires and one of the first metal electrode and second metal electrode, and each of the plurality of light segments corresponds to one of the plurality of nanowires; and
judging the plurality of nanowires according to the plurality of light segments, when one of the plurality of light segments extends from the first metal electrode to the second metal electrode, the corresponding one of the plurality of nanowires is a metallic nanowire; when one of the plurality of light segments is broken between the first metal electrode and the second metal electrode, the corresponding one of the plurality of nanowires is a semiconducting nanowire.

14. The method as claimed in claim 13, wherein the plurality of nanowires are silicon nanowires, silica nanowires, zinc oxide nanowires, carbon nanotubes, molybdenum disulfide, or graphene nanoribbons, and the substrate is a silicon substrate, a silica substrate, or a quartz substrate.

15. The method as claimed in claim 13, wherein the plurality of nanowires are a plurality of single-walled carbon nanotubes (SWCNTs).

16. The method as claimed in claim 13, wherein each of the first metal electrode and the second metal electrode comprise a material selected from the group consisting of titanium, palladium, gold, chromium, aluminum, and scandium.

17. The method as claimed in claim 13, wherein the plurality of nanowires is parallel with and spaced apart from each other; and each of the first metal electrode and the second metal electrode is substantially perpendicular to the plurality of nanowires.

* * * * *